United States Patent [19]

Satoh et al.

[11] Patent Number: 4,978,879
[45] Date of Patent: Dec. 18, 1990

[54] ACOUSTIC SURFACE WAVE ELEMENT

[75] Inventors: Kiyoshi Satoh; Yoshiro Fujiwara; Kazushi Hashimoto, all of Kawasaki, Japan

[73] Assignee: Fujitsu Limited, Kawasaki, Japan

[21] Appl. No.: 384,829

[22] Filed: Jul. 25, 1989

[30] Foreign Application Priority Data

| Jul. 27, 1988 | [JP] | Japan | 63-187704 |
| Jul. 27, 1988 | [JP] | Japan | 63-187705 |
| Oct. 26, 1988 | [JP] | Japan | 63-270275 |
| Nov. 1, 1988 | [JP] | Japan | 63-276761 |

[51] Int. Cl.$^5$ ............................................. H01L 41/08
[52] U.S. Cl. ............................ 310/313 A; 310/313 D; 310/313 R; 333/194
[58] Field of Search ................ 310/313; 333/193, 194, 333/150, 151, 154

[56] References Cited

U.S. PATENT DOCUMENTS

| 3,786,373 | 1/1974 | Schulz et al. | 310/313 A |
| 3,795,879 | 3/1974 | Whitehouse et al. | 310/313 A |
| 3,952,268 | 4/1976 | Schulz et al. | 319/313 A |
| 3,965,444 | 6/1976 | Willingham et al. | |

FOREIGN PATENT DOCUMENTS 47-37154 11/1972 Japan.
55-159612 12/1980 Japan.

OTHER PUBLICATIONS

W. Chujo et al., "SiO$_2$/LiTaO$_3$, LiNbO$_3$ Structure Acoustic Surface Wave Materials Fablicated by Plasma CVD Method", Dentsu Gakkai Cho-ompha Kenkyu Shiryo US80-3, Apr. 1980, pp. 15–20.

W. Chujo et al., "SiO$_2$/LiTaO$_3$, LiNbO$_3$ Structure Acoustic Surface Wave Materials Fablicated by Plasma CVD Method", Dentsu Gakkai Cho-ompa Kenkyu Shiryo US79-16, Jun. 1979, pp. 25–30.

*Primary Examiner*—Mark O. Budd
*Attorney, Agent, or Firm*—Staas & Halsey

[57] ABSTRACT

An acoustic surface wave element having an oscillation frequency stable against temperature changes, and a wide range of oscillation frequency adjustment, is provided by an acoustic surface wave element comprising: a substrate of a 36° rotated Y-cut single crystal lithium tantalate having X, Y and Z crystal axes and a top surface and side walls; electrodes formed on the top surface of the substrate such that an acoustic surface wave is propagated in a direction of the X-axis of the substrate and an oscillation of the acoustic surface wave occurs at a predetermined frequency, the electrodes having a thickness equal to 1 to 4% of a wavelength of the acoustic surface wave at the oscillation; and a plasma CVD-deposited layer of silicon dioxide covering the electrodes and the substrate, the silicon dioxide layer having a refractive index of 1.445 to 1.486 and a thickness equal to 16 to 26% of the wavelength of the acoustic surface wave at the oscillation.

9 Claims, 19 Drawing Sheets

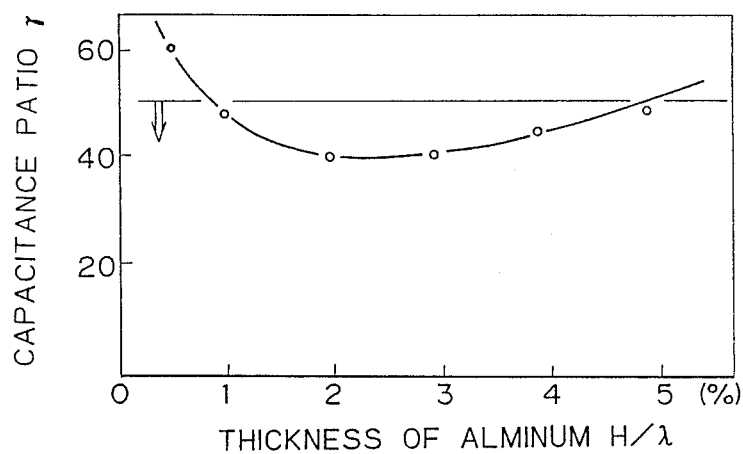
Fig.5A RELATIONSHIP BETWEEN CAPACITANCE RATIO AND THICKNESS OF ALMINUM
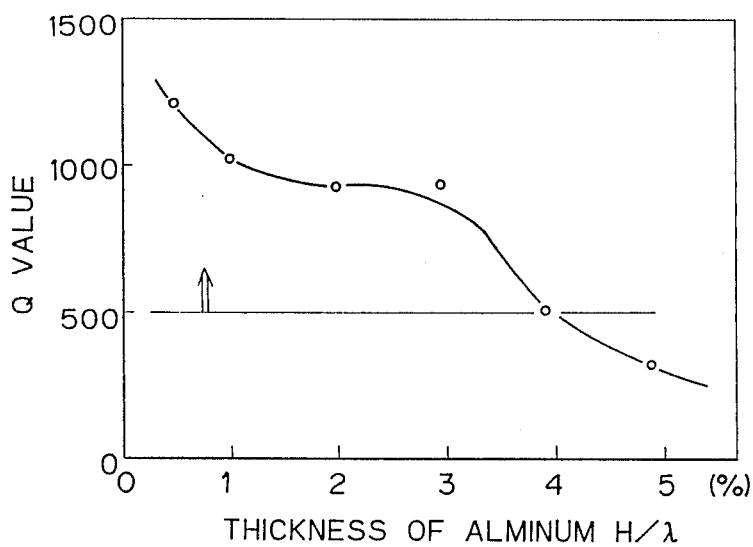
Fig.5B RELATIONSHIP BETWEEN Q VALVE AND THICKNESS OF ALMINUM

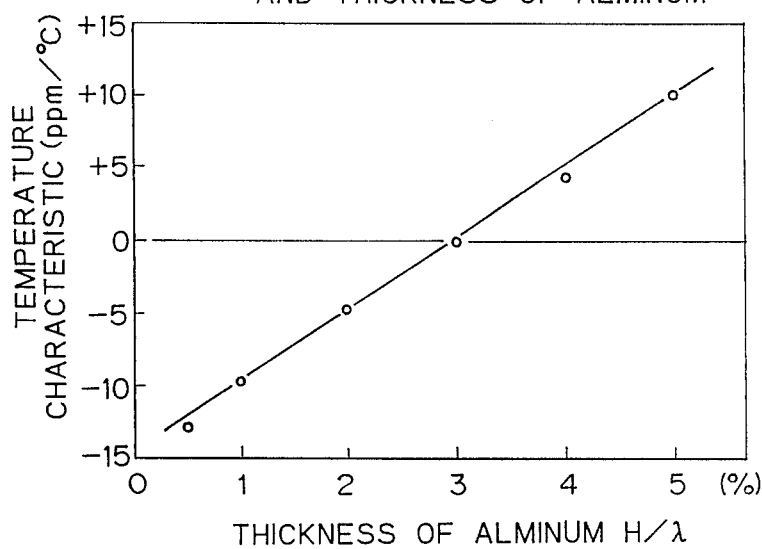
Fig.5C RELATIONSHIP BETWEEN TEMPERATURE CHARACTERISTIC AND THICKNESS OF ALMINUM
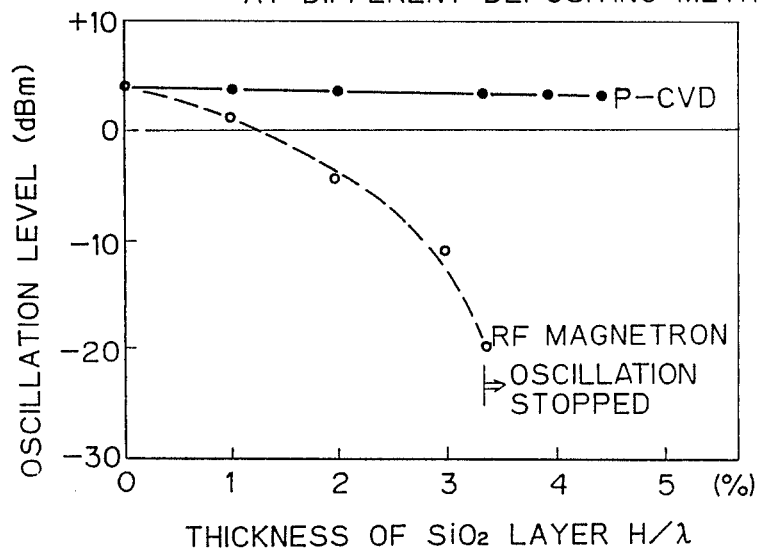
Fig.6A RELATIONSHIP BETWEEN OSCILLATION LEVEL AND THICKNESS OF SiO₂ LAYER AT DIFFERENT DEPOSITING METHODS

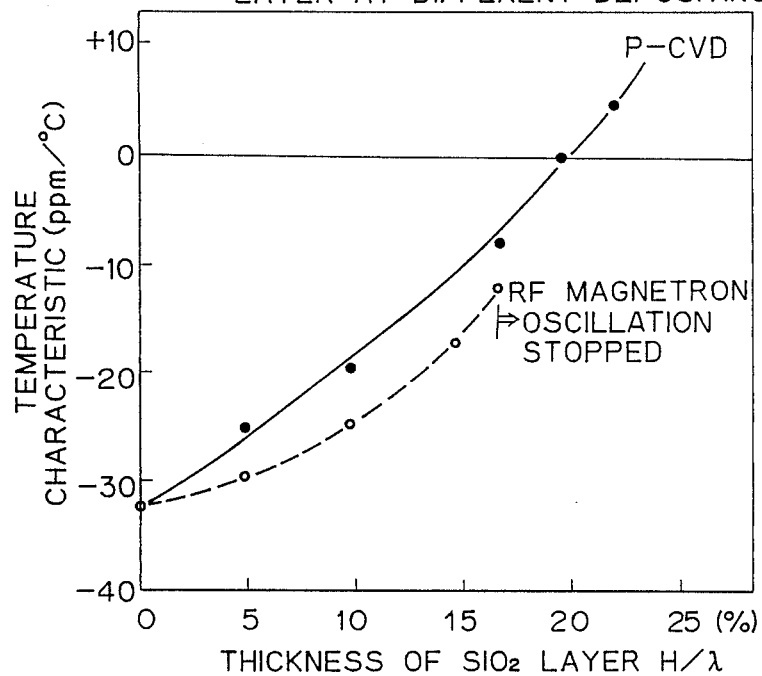
Fig. 6B RELATIONSHIP BETWEEN TEMPERATURE CHARACTERISTIC AND THICKNESS OF $SiO_2$ LAYER AT DIFFERENT DEPOSITING METHODS
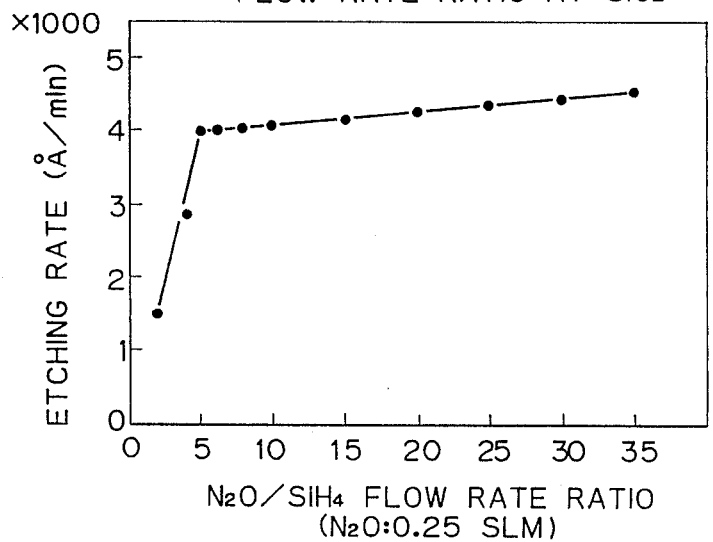
Fig. 7A RELATIONSHIP BETWEEN ETCHING RATE AND $N_2O/SiH_4$ FLOW RATE RATIO AT $SiO_2$

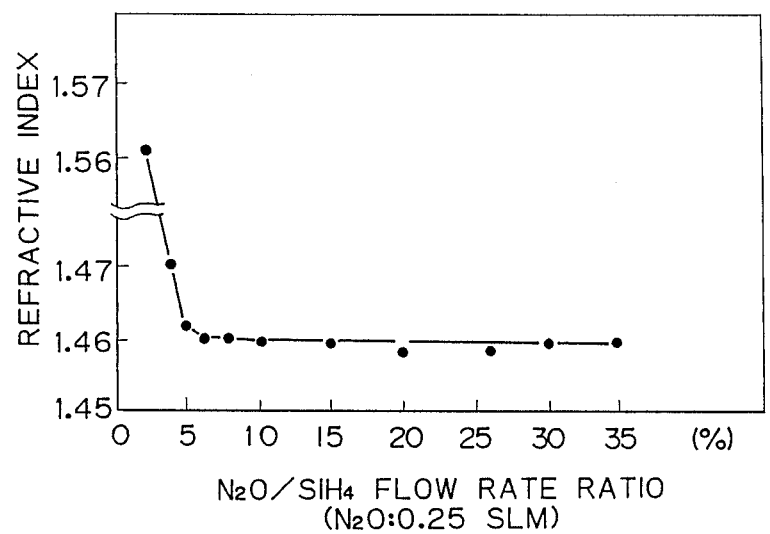
Fig. 7B RELATIONSHIP BETWEEN REFRACTIVE INDEX AND N₂O/SiH₄ FLOW RATE RATIO AT SiO₂
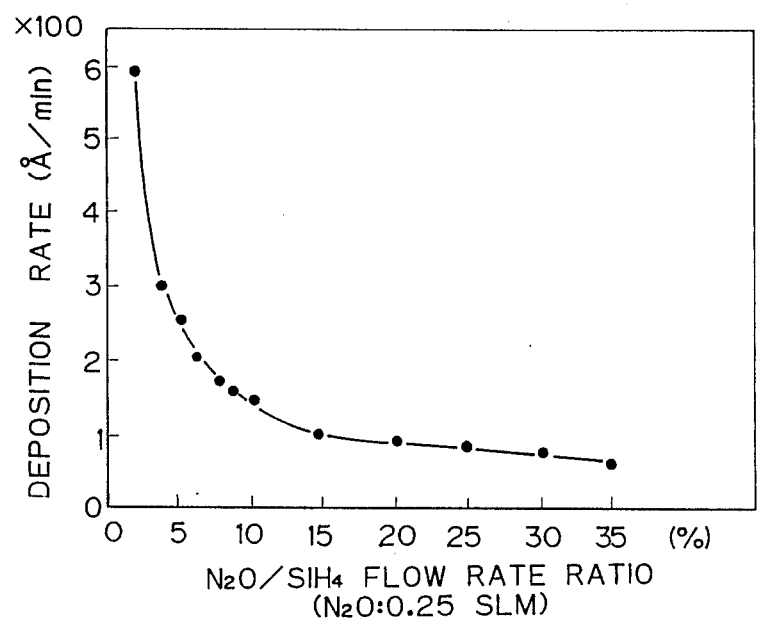
Fig. 7C RELATIONSHIP BETWEEN DEPOSITION RATE AND N₂O/SiH₄ FLOW RATE RATIO AT SiO₂

Fig.8A OSCILLATION LEVEL VS. THICKNESS RATIO OF SiO₂ LAYER
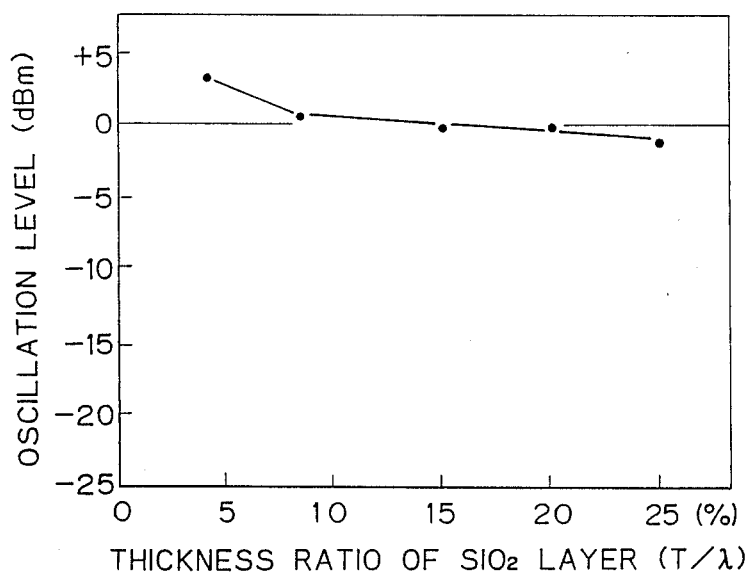
Fig.8B TEMPERATURE CHARACTERRISTIC OF OSCILLATION FREQUENCY VS. THICKNESS RATIO OF SiO₂ LAYER
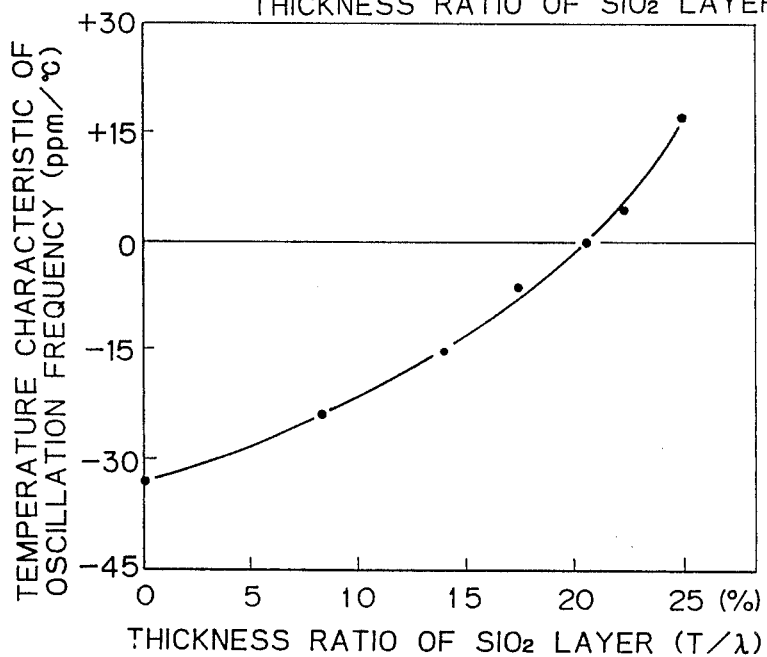

4,978,879

ACOUSTIC SURFACE WAVE ELEMENT

BACKGROUND OF THE INVENTION

1. Field of the Invention

The present invention relates to an acoustic surface wave element, which can be used for a voltage controlled oscillator (VCO), a resonator, a filter, and like components of communication equipment, such as a car telephone and a cordless telephone, and of audio equipment, such as a video tape recorder (VTR). In the above equipment, an acoustic surface wave element is currently widely used at a frequency of 10 MHz to 1 GHz, and must have a wider frequency deviation range and an excellent stability characteristic relative to temperature when used, for example, as a VCO.

2. Description of the Related Art

An acoustic surface wave delay line is known which comprises a substrate of a propagation media and a surface layer of a media having a temperature dependency delay time opposite to that of the substrate so that the temperature dependency delay time of the substrate is reduced (Japanese Unexamined Patent Publication (Kokai) No. 47-37154, published on Nov. 30, 1972). This disclosure relates to a general reduction of the temperature dependency delay time of a propagation media and is exemplified only by a combination of a fused quartz aluminum. The propagation mediums mentioned are lithium niobate, lithium tantalate, and cadmium surfide.

A silicon dioxide layer for the above surface layer has been proposed, to reduce the temperature dependency delay time of propagation mediums of an acoustic surface wave device (U.S. Pat. No. 3,965,444, issued on June 22, 1976). As piezoelectric materials used for the propagation mediums, there are mentioned YZ-cut lithium niobate and YZ-cut lithium tantalate (col. 4, 1.2-4 of USP' 444), but such an acoustic surface wave device is difficult to manufacture because, in the case of the YZ-cut lithium tantalate (the acoustic velocity therein is 3230 m/s), at 150 MHz the hK (h=film thickness of the silicon dioxide layer and K=$2\pi/\lambda$ where $\lambda$=acoustic wavelength) becomes 3 (col. 4, 1.31-35 of USP' 444), and thus the thickness of the silicon dioxide layer must be at least 10.3 μm. A silicon dioxide layer having a thickness of 10 μm causes an increased stress in the layer and a longer deposition time (for example, about 11 hours at a deposition rate of 150 angstroms/min), among other disadvantages.

Also known is an acoustic surface wave element comprising a combination of $SiO_2$/$LiTaO_3$ (Japanese Unexamined Patent Publication (Kokai) No. 55-159612, published on Dec. 11, 1980). This invention uses an X-cut $LiTaO_3$ at an acoustic propagation direction of 112° to the Y-axis. This acoustic surface wave element obtained a large electromechanical coupling factor of 1.44%, but this is a small electromechanical coupling factor for an acoustic surface wave element using a single crystal of $LiTaO_3$ and allows only a narrow frequency deviation range for the acoustic surface wave element. Further, the electromechanical coupling factor is varied depending on the thickness of the $SiO_2$ layer, and thus it is difficult to manufacture this type of an acoustic surface wave element. Furthermore, a problem arises in that, with an increase of the thickness of the $SiO_2$ layer, the inductance component is reduced and the equivalent series resistance is increased, finally resulting in a stopping of the oscillation.

Further, there is reported a structure of $SiO_2$/36° Y-X $LiTaO_3$ for an acoustic surface wave device (W. Chujo et al, "$SiO_2$/$LiTaO_3$, $LiNbO_3$ Structure Acoustic Surface Wave Materials Fabricated by Plasma CVD Method", Dentsu Gakkai Cho-ompa Kenkyu Shiryo US 80-3, Apr. 1980, pp. 15–20; and W. Chujo et al, "$SiO_2$/$LiTaO_3$, $LiNbO_3$ Structure Acoustic Surface Wave Materials Fabricated by Plasma CVD Method", Dentsu Gakkai Cho-ompa Kenkyu Shiryo US 79-16, Jun. 1978, pp 25–30). Here, a zero temperature coefficient of a delay (TCD) is reported at $T/\lambda = 0.11$ (T is the film thickness of the silicon dioxide layer and $\lambda$ is a wavelength). From experiments by the present inventors, it was found that a relatively thick aluminum layer is necessary to attain a zero TCD at a $T/\lambda$ (where T is a thickness of the silicon dioxide layer) of about 0.11, and the $t/\lambda$ (where t is the thickness of an aluminum layer) becomes more than 0.05, lowering the oscillation characteristics.

Quartz can be used as a substrate of an acoustic surface wave element to obtain not more than 100 ppm of TCD at $-20°$ C. to $+70°$ C., but quartz has a very small electromechanical coupling factor and is not suitable for use in a VCO with a wide frequency deviation range.

SUMMARY OF THE INVENTION

The present invention provides an acoustic surface wave element which comprises: a substrate of a 36° rotated Y-cut single crystal lithium tantalate having X, Y and Z axes and a top surface and side walls, electrodes formed on the top surface of the substrate such that an acoustic surface wave is propagated in the direction of the X-axis of the substrate and an oscillation of the acoustic surface wave occurs at a predetermined frequency, the electrodes having a thickness equal to 1 to 4% of a wavelength of the acoustic surface wave at the oscillation, and a plasma CVD-deposited layer of silicon dioxide covering the electrodes and the substrate, the silicon dioxide layer having a refractive index of 1.445 to 1.486 and a thickness in a range of from 16 to 26% of the wavelength of the acoustic surface wave at the oscillation.

The acoustic surface wave element according to the present invention is particularly suitable for oscillation at a frequency in a range of 70 MHz to 1 GHz.

BRIEF DESCRIPTION OF THE DRAWINGS

FIGS. 5A–5C show are plats of the characteristics of an acoustic surface wave element in relation to the thickness of the electrodes;

FIGS. 6A and 6B and 6C are plats of show the characteristics of an acoustic surface wave element depending on the methods of forming the silicon dioxide layer;

FIGS. 7A-7C shows the characteristics of the silicon dioxide layer depending on the flow rate ratio of $N_2O/SiH_4$;

FIGS. 8A and 8B shows the characteristics of an acoustic surface wave element in relation to the thickness of the silicon dioxide layer;

DESCRIPTION OF THE PREFERRED EMBODIMENTS

The following table shows electromechanical coupling factors and temperature coefficients of the oscillation frequency (TCF) of various single crystal substrates.

TABLE

| Crystal | Cut direction | Coupling factor | TCF |
| --- | --- | --- | --- |
| LiTaO₃ | 112° Y-X | 0.75% | −18 ppm/°C. |
| LiTaO₃ | 36° Y-X | 4.7% | −32 ppm/°C. |
| LiNbO₃ | 128° Y-X | 5.5% | −72 ppm/°C. |
| Quartz | 42.75° Y-X | 0.16% | 0 |

From the above table it is seen that the 36° Y-X substrate (cut from a Y-substrate rotated around the X-axis to the Z-axis by 36°) of an LiTaO₃ single crystal has a superior coupling factor to that of quartz but an inferior TCF; a superior coupling factor to that of the 112° Y-X substrate of LiTaO₃ single crystal but a slightly inferior TCF; and a superior coupling factor to that of the 128° Y-X substrate of LiNbO₃ single crystal in TCF but a slightly inferior TCF. The present invention provides an efficient and stable acoustic surface wave element by using this 36° Y-X substrate of LiTaO₃ single crystal while specifying the thickness of electrodes relative to the wavelength of the oscillation acoustic surface wave, and depositing a silicon dioxide layer having a thickness specified relative to the wavelength of the oscillation acoustic surface wave over the electrodes and substrate, by plasma CVD.

Figure 1A:
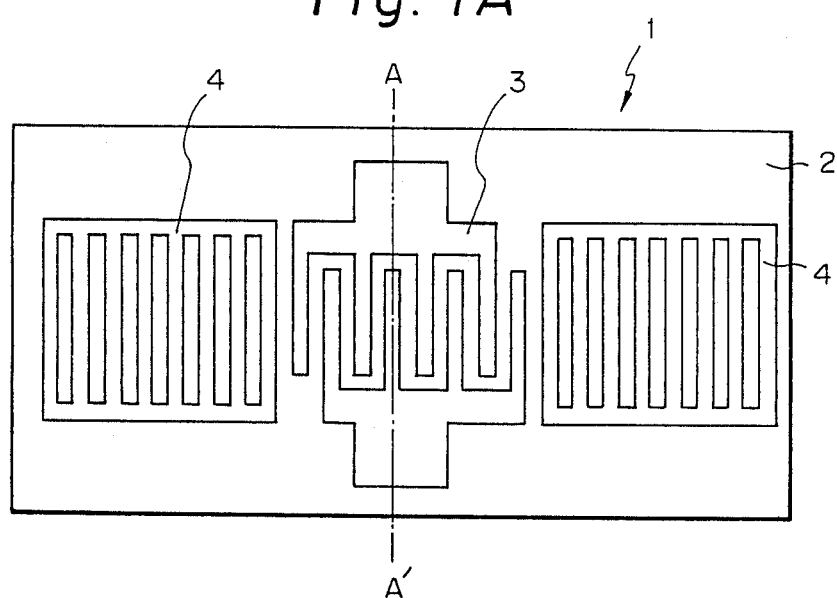
FIGS. 1A and 1B are plan and sectional views of an acoustic surface wave element according to the present invention.
Figure 1B:
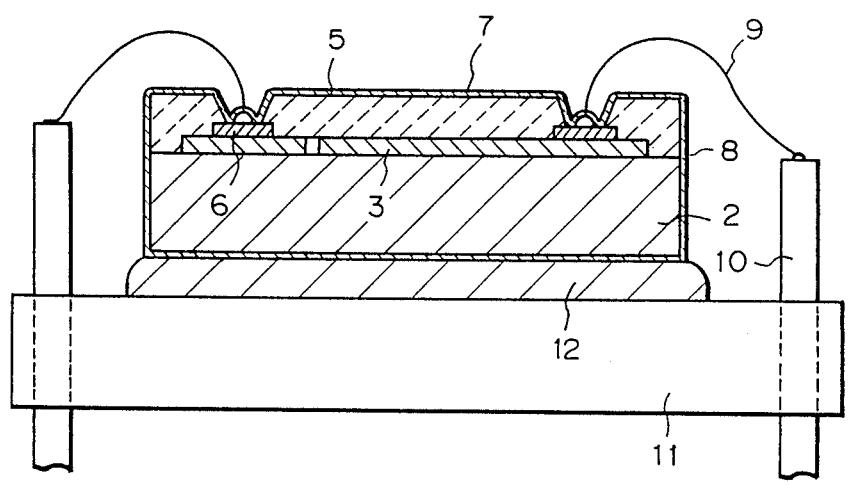

FIGS. 1A and 1B illustrate an acoustic surface wave element according to the present invention. In these figs., 1 denotes an acoustic surface wave element, 2 a substrate of 36° Y-X LiTaO₃ single crystal, 3 drive electrodes, 4 reflective electrodes, 5 a silicon dioxide layer, 6 an etching stopper, 7 an insulator for adjusting an oscillation frequency, 8 a pyroelectricity preventing film, 9 wires, 10 take-out pins, 11 a stem, and 12 an adhesive.

Figure 2:
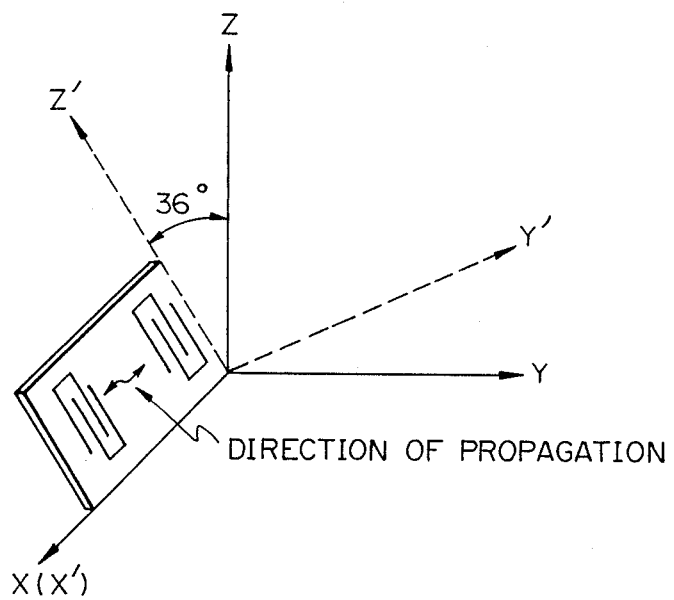
FIG. 2 shows a 36° rotated Y-cut single crystal lithium tantalate with a propagation of an acoustic surface wave in the X-axis direction.
Figure 3:
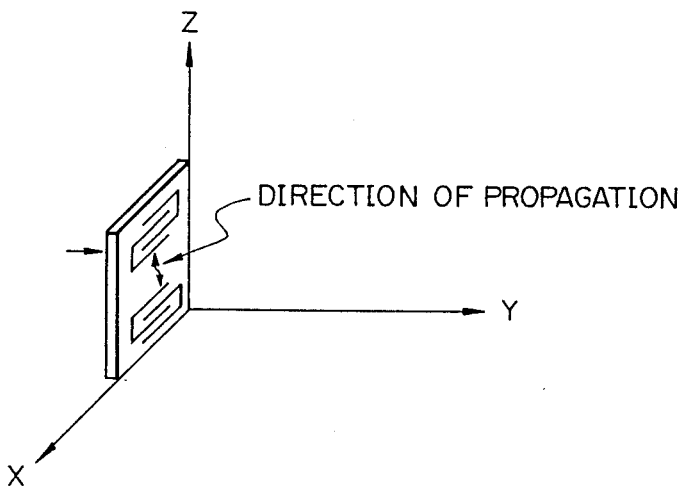
FIG. 3 shows a Y-Z substrate.

FIG. 2 illustrates a substrate 2 of 36° Y-X LiTaO₃ single crystal, which has a main surface involving the directions X and Z' and, the right angle to the main surface being in the direction of Y', and wherein the X, Y and Z axes are the crystal axes of the LiTaO₃. As seen in FIG. 2, the Y' axis is rotated around the X axis toward the Z axis by 36°. The electrodes 3 and 4 are formed on the main surface of the substrate 2 such that an acoustic surface wave is propagated in the direction of the X axis. For reference, FIG. 3 illustrates a Y-Z substrate cut perpendicularly to the Y axis, i.e., in the plane of the X and Z axes, wherein electrodes are formed on a main surface of the substrate such that an acoustic surface wave is propagated in the direction of the Z axis.

Figure 4A:
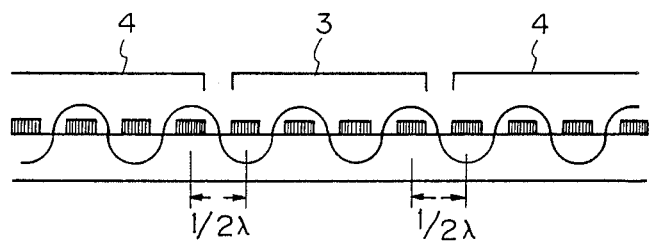
FIGS. 4A and 4B are sectional views of acoustic surface wave elements according to the present invention and of the prior art respectively.
Figure 4B:
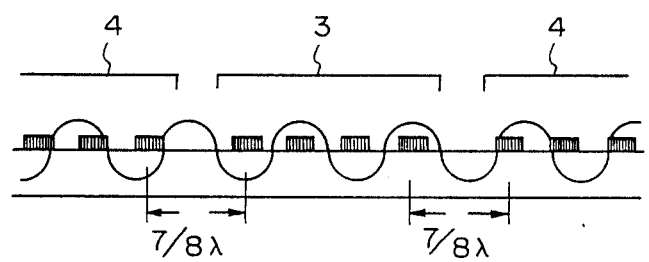

The drive electrodes 3 are in the form of fingers and the reflective electrodes 4 are in the form of grids, as shown in FIG. 1A. The fingers of the drive electrodes 3 and the grids of the reflective electrodes 4 are arranged at a pitch of ½λ (where λ is a wavelength of an acoustic surface wave of a desired oscillation frequency), as shown in FIG. 4A. FIG. 4B illustrates an arrangement of electrodes in the prior art, in which the pitch between the drive electrodes 3 and the reflective electrodes 4 is ⅜λ. For example, when the oscillation frequency is 150 MHz, the width of the finger and the grid of the electrodes is 6.6 μm and the pitch thereof is 13.2 μm. The number of fingers of the drive electrodes is 70 pairs and the number of the grids of the reflective electrodes is 50 pairs. By the above arrangement of the electrodes, the energy of the acoustic surface wave is confined in the substrate and an oscillation is caused by a multiple reflection thereof. In FIG. 4A, the oscillation involves no spurious effects and the Q value (stability) of the oscillation is improved in comparison with that of the prior art as shown in FIG. 4B.

FIG. 5, FIGS. 5A, 5B and 5C respectively are plots of the shows a capacitance ratio γ, stability Q. and temperature coefficient of the oscillation frequency, of an oscillation in relation and to as a function of the thickness of the electrodes (as plotted on the common abscissa in FIG. 5C) in this case, aluminum. Concerning a VCO, the width of frequency deviation is wider when the capacitance ratio γ is smaller, and therefore, preferably the capacitance ratio γ is small and the H/λ (where H is thickness of electrodes and λ is wavelength of oscillation acoustic surface wave) is not less than 1%, as seen from FIG. 5A. The stability Q is preferably not less than 500, and therefore, the H/λ is not more than 4%. From these oscillation characteristics, the thickness of the aluminum electrodes is preferably from 1 to 4% as determined from the value H/λ. The bottom graph of FIGS. 5C shows the temperature coefficient of the oscillation frequency of the oscillator in relation to the thickness of the electrodes when the thickness of the silicon dioxide layer is adjusted such that the temperature coefficient of the oscillation frequency of the oscillator becomes zero when H/λ=3. This graph indicates that not less than 1% of H/λ is preferably from the view point of an improved efficiency of the temperature coefficient of the oscillation frequency. Therefore, it is clear from the above that the H/λ value (where H is the thickness of the electrodes) is preferably 1 to 4%, more preferably 2% to 3%.

The materials of the electrodes are not limited to aluminum and include aluminum-silicon alloy (10 wt % or less Si), aluminum-copper alloy (10 wt % or less Cu), aluminum-titanium alloy (10 wt % or less Ti), aluminumtitanium copper alloy (10 wt % or less Ti+Cu), and any of the above-aluminum-alloys/titanium bilayer, etc. The electrodes may be formed in any conventional manner, for example, by depositing aluminum and then patterning.

The silicon dioxide layer is preferably formed by plasma CVD. FIGS. 6 and 6B are plats of the shows characteristics of an oscillator as a function of the thickness of an SIO$_2$ layer H/λ plotted on the common abscissa of FIG. 6B when the silicon dioxide layer is formed alternatively by plasma CVD and by RF magnetron sputtering as a function of the thickness. When the silicon dioxide layer is formed by magnetron sputtering, the oscillation level is lowered (FIG. 6A) and the oscillation stops before the temperature coefficient (FIG. 6B) reaches zero, with an increase of the thickness of the silicon dioxide layer. Therefore, magnetron sputtering is not efficient for the purpose of the present invention. The differences in the characteristics of layers formed by plasma CVD and RF magnetron sputtering can be easily found from the deposited layer per se and/or the characteristics of the oscillator which employs the layer.

FIGS. 7A to 7C are plots of shows characteristics of a silicon dioxide layer formed by plasma CVD relative to the N$_2$O/SiHc Flow Rate Ratio commonly plotted on the abscissa in FIG. 7C. As source gases, nitrogen suboxide (N$_2$O) and silane (SiH$_4$) were used. The reaction occurred as shown by the following formula:

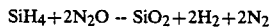

$$SiH_4 + 2N_2O \rightarrow SiO_2 + 2H_2 + 2N_2$$

The flow rate of N$_2$O was constant, 0.25 sccm, and the flow rate ratio between N$_2$O and SiH$_4$was varied. The top graph of FIG. 7A shows the etching rate, the middle graph of FIG. 7B shows the refractive index, and the bottom graph of FIG. 7C shows the deposition rate. When the flow rate ratio of N$_2$O/SiH$_4$ is less than 5/1, the etching rate is lowered and the refractive index (FIG. 7B) is increased so that the silicon dioxide layer becomes silicon rich. Accordingly, the flow rate (FIG. 7C) ratio of N$_2$O/SiH$_4$ of 5/1 or more was used, even though the deposition rate became low.

FIGS. 8A and 8B are plots showing shows the oscillation level and the temperature characteristic of the oscillation frequency (FIG. 8B) in relation to the thickness of the silicon dioxide layer. The thickness of the silicon dioxide layer is expressed as T/λ (where T is a thickness of the silicon dioxide layer and λ is a wavelength of the oscillation acoustic surface wave). The temperature characteristic of the oscillation frequency is expressed in the unit "ppm/° C.", i.e., difference of oscillation frequency in ppm per change of temperature of 1° C. The acoustic surface wave element used for the measurement had aluminum electrodes having a thickness of 3% of λ. With a silicon dioxide layer deposited at a flow rate ratio of N$_2$O/SiH$_4$ of not less than 5/1 by plasma CVD (FIG. 8B), substantially no lowering of the oscillation level occurs (FIG. 8A) and a zero temperature coefficient is obtained near T/λ=20%.

Figure 9:
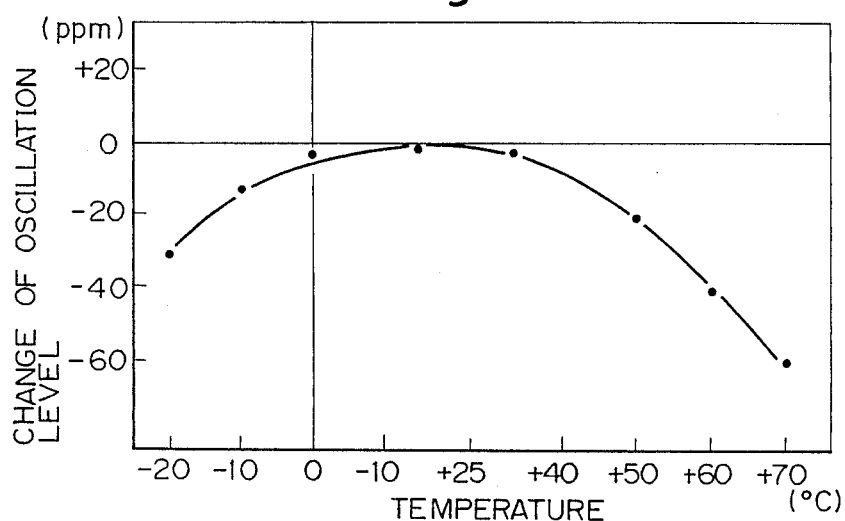
FIG. 9 shows the change of the oscillation frequency in relation to the temperature.

FIG. 9 shows the change of the oscillation frequency in relation to temperature at the above zero temperature coefficient. In FIG. 9, the change of the oscillation frequency is excellent and is within 10 ppm at a temperature range of −10° C. to +45° C.

Figure 10:
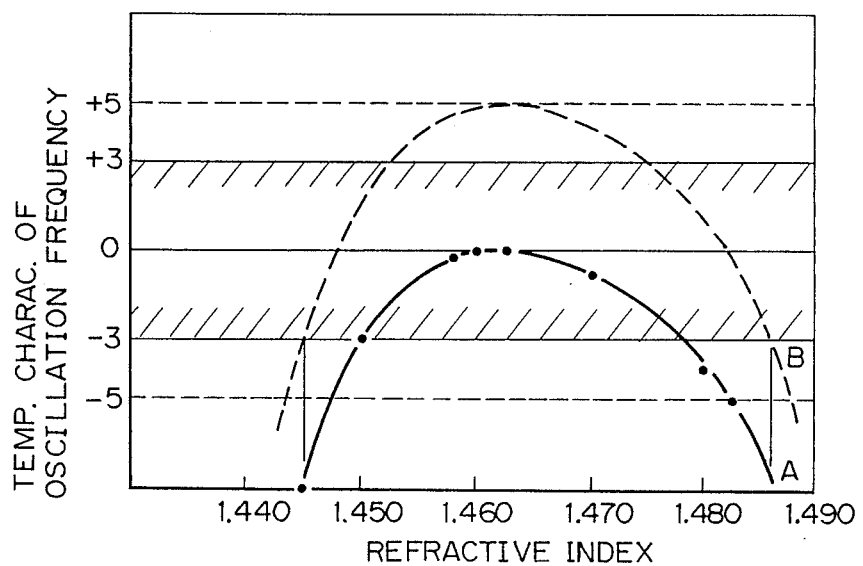
FIG. 10 shows the temperature characteristic of the oscillation frequency in relation to the refractive index of the silicon dioxide layer.
Figure 11:
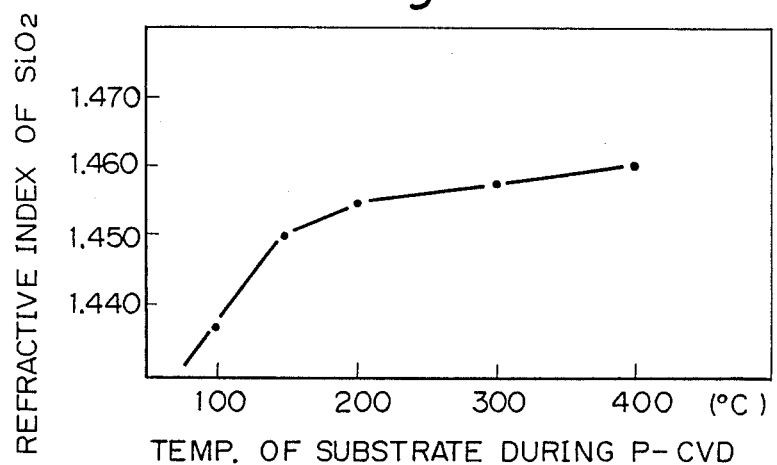
FIG. 11 shows the refractive index of the silicon dioxide layer in relation to the temperature of the substrate during the plasma CVD.

FIG. 10 shows the temperature characteristic of the oscillation frequency in relation to the refractive index, in which the solid line A shows the thickness of the silicon dioxide layer obtaining a zero temperature coefficient at a refractive index of 1.46 (at a refractive index of 1.46, the thickness of the silicon dioxide layer obtaining a zero temperature coefficient is minimum), and the broken line B shows the thickness of the silicon dioxide layer obtaining a temperature coefficient of +5 ppm/° C. at a refractive index of 1.46. Since the desired temperature characteristic of the oscillation frequency is within ±3 ppm/° C., the refractive index of the silicon dioxide layer is preferably 1.445 to 1.486, but as seen in FIG. 11, a small refractive index of the silicon dioxide layer can be obtained by adjusting the temperature of the substrate during deposition, even though it is difficult to control the temperature of the substrate for a small refractive index, and therefore, a refractive index range of 1.450 to 1.486 is preferable.

Figure 12:
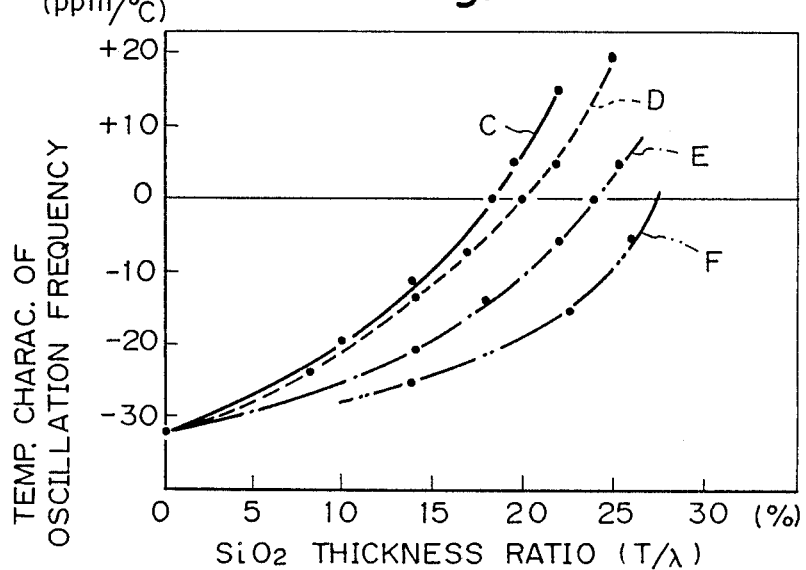
FIG. 12 shows the temperature characteristic of the oscillation frequency in relation to the thickness of the silicon dioxide layer, in which the refractive index of the silicon dioxide layer is changed.

FIG. 12 shows a change of the oscillation frequency in relation the thickness of silicon dioxide layer T/λ, in which the refractive index of the silicon dioxide layer and the thickness of the aluminum electrodes (t) were varied. For the oscillator shown by the solid line C in FIG. 12, the refractive index is 1.46 and the t/λ is 4%. For that shown by the broken line D, the refractive index is 1.46 and the t/λ is 3%. For that shown by the dotted line E, the refractive index is 1.46 and the t/λ is 1%. For that shown by the two-dotted line F, the refractive index is 1.75 and the t/λ is 3%. As described before, the thickness of the electrodes is preferably 1% to 4% as the value of t/λ, and therefore, when the lines C, D, E and F are seen from this viewpoint, the temperature characteristic of the oscillation frequency is changed with, i.e. determined by, the value T/λ and thus the T/λ value is preferably in the range of 18% to 24% for a temperature coefficient of the oscillation coefficient within ±5 ppm/° C.

Figure 13:
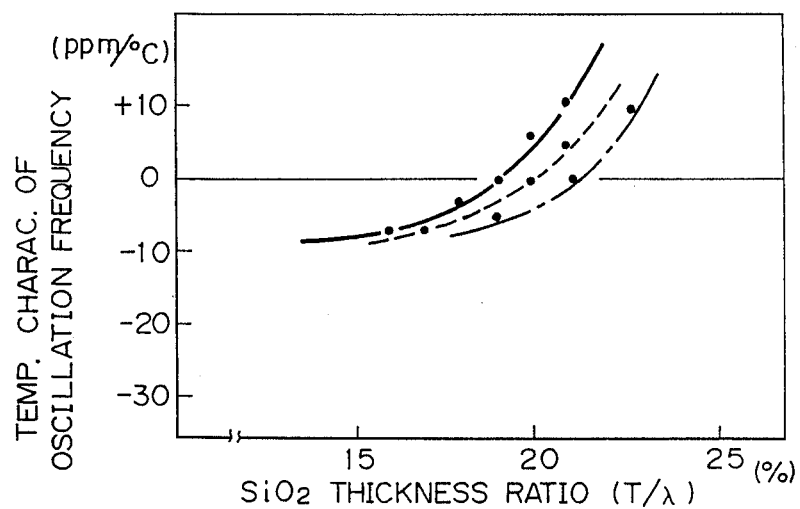
FIG. 13 shows the temperature characteristic of the oscillation frequency in relation to the thickness of the silicon dioxide layer, in which the flow ratio of $N_2O/SiH_4$ is changed.

FIG. 13 shows the temperature characteristic of the oscillation frequency in relation to the thickness ratio of the silicon dioxide layer (T/λ), in which the dotted line indicates a flow rate ratio of N$_2$O/SiH$_4$ of 5/1, the broken line a flow rate ratio of 10/1, and the solid line a flow rate ratio of 20/1. This figure shows that the temperature characteristic of the oscillation frequency is changed by varying the flow rate ratio of N$_2$O/SiH$_4$.

From the above data, the following conclusions are reached.

(1) To obtain a zero temperature coefficient of the oscillation frequency at a ratio of the thickness of the electrodes to the oscillation frequency (T/λ) in the range of 1 to 4%, the ratio of the thickness of the silicon dioxide layer to the oscillation frequency (T/λ) is preferably in the range of 18% to 24%.

(2) The deviation of the ratio of the thickness of the silicon dioxide layer to the oscillation frequency (T/λ) is preferably within ±1%, when considering the flow rate ratio of $N_2O/SiH_4$.

(3) To suppress the temperature coefficient of the oscillation frequency to within ±5 ppm/° C., the ratio of the thickness of the silicon dioxide layer to the oscillation frequency (T/λ) is preferably in the range of 17% to 25%.

(4) To suppress the temperature coefficient of the oscillation frequency to within ±5 ppm/° C., considering the deviation of the ratio of the thickness of the silicon dioxide layer to the oscillation frequency (T/λ), the ratio of the thickness of the silicon dioxide layer to the oscillation frequency (T/λ) is preferably within the range of 16% to 26% and the refractive index is preferably within the range of 1.455 to 1.488, as described above. A preferable ratio of the thickness of the silicon dioxide layer to the oscillation frequency (T/λ) is within 18% to 22%.

Figure 14:
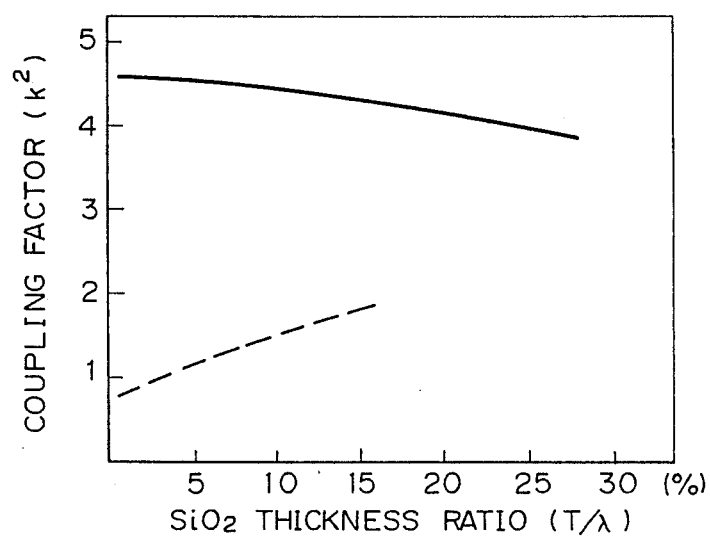
FIG. 14 shows the electromechanical coupling factor in relation to the thickness of the silicon dioxide layer.

FIG. 14 shows the electromechanical coupling factor in relation to the ratio of the thickness of the silicon dioxide layer to the oscillation frequency (T/λ), in which the solid line indicates a 36° Y-X substrate according to the present invention and the broken line shows a 112° Y-X substrate. It is seen that the change of the electromechanical coupling factor of the 36° Y-X substrate is much smaller than that of the 112° Y-X substrate.

Figure 15:
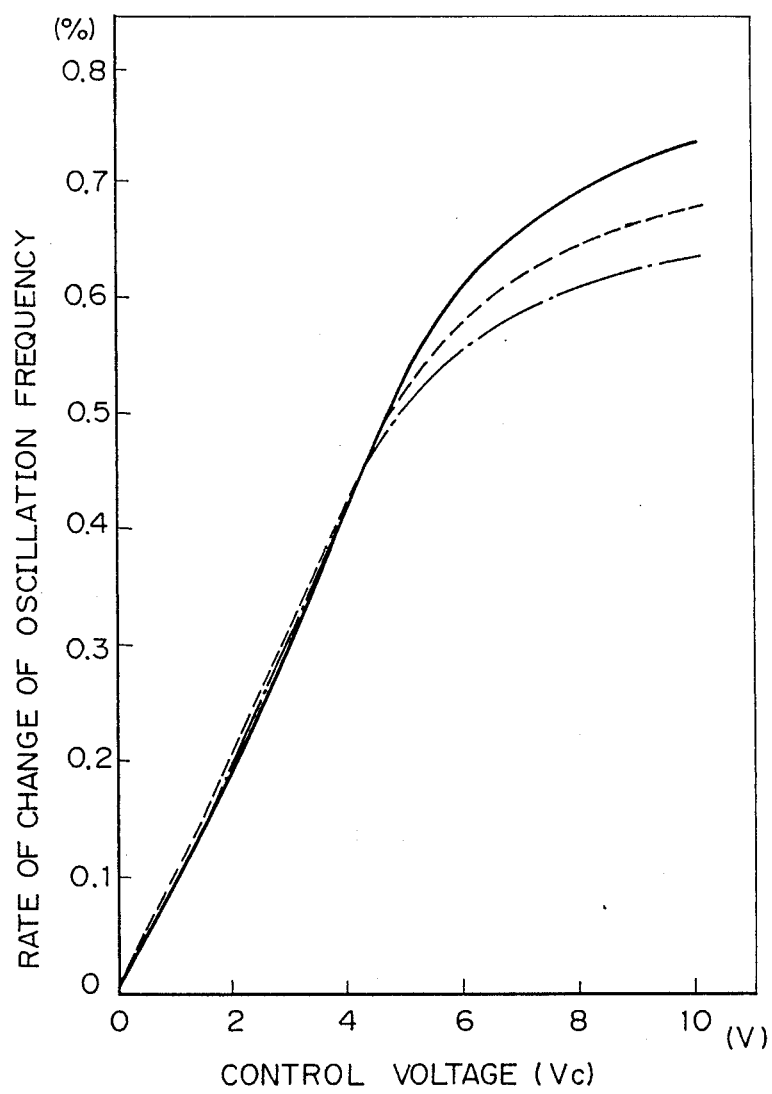
FIG. 15 shows the rate of change of the oscillation frequency in relation to the control voltage.

FIG. 15 shows a rate of change of the oscillation frequency in relation to a control voltage, in which the solid line indicates a ratio of the thickness of the silicon dioxide layer to the oscillation frequency (T/λ) of 19.5%, the broken line that of 20.0%, and the dotted line that of 20.5%. It is seen that the rate of change of the oscillation frequency of the respective elements is varies at almost linearly with the control voltage at a voltage of 5 V or and the linear portion is about 0.1%/V.

Using a 36° Y-X substrate of $LiTaO_3$, for example, in an acoustic surface wave element for a VCO with an oscillation frequency of 155 MHz, the width of the frequency deviation is 900 ppm/V to 1200 ppm/V, which is far wider than that of a 112° Y-X substrate of $LiTaO_3$ of 50 ppm/V to 150 ppm/V, and the temperature coefficient of the oscillation frequency is within ±5 ppm/° C. and may be made zero by approximately selecting the thickness of the electrodes and the conditions of the plasma CVD of the silicon dioxide layer.

Returning to FIG. 1B, the electrodes 3 are electrically connected to an external circuit through the wires 9 and the pins 10, and the silicon dioxide layer 5 is locally etched so that the wires 9 can be bonded to the electrodes 3. The local etching is preferably carried out by wet etching, to ensure that the electrodes 3 are not damaged, but inevitably the electrodes are slightly etched which is not preferable. To prevent this unfavorable etching during the local etching of the silicon dioxide layer 5 an etching stopper 6 of a metal may be formed before depositing the silicon dioxide layer 5, so that the electrodes 3 are not damaged during the local etching of the silicon dioxide layer 5. The metal of the etching stopper 6 may be, for example, chromium, nickel, cobalt etc.

Also in FIG. 1B, an insulation layer 7 is provided for adjusting an oscillation frequency preferably form of tantalun pentaoxide. In the prior art, the adjusting of the oscillation frequency is carried out by adjusting the width or thickness of the electrodes, etc., but this is difficult when the patterns of the electrodes are fine. To solve this difficulty, in accordance with the present invention, the insulation layer 7 is deposited over the silicon dioxide layer 5 at an appropriate thickness preferably while measuring or monitoring the oscillation frequency of the element, so that the oscillation frequency is adjusted to a desired frequency. This method of adjusting the oscillation frequency is easy, effective and precise. For example, if a silicon oxide film is deposited over the silicon dioxide layer 5 by electron beam evaporation, the acoustic velocity is faster in the lithium tantalate than in the silicon dioxide layer and the silicon oxide film in that order, and as a result, the oscillation frequency of the acoustic surface wave element of lithium tantalate is reduced by the presence of the silicon dioxide layer, which is further reduced by the presence of the silicon oxide film. The silicon oxide film may be replaced by a film of, for example, tantalun pentaoxide or silicon nitride. Alternatively, the surface of the silicon dioxide layer 5 can be etched to increase the oscillation frequency of the element. Therefore, by these methods of adjusting the oscillation frequency, particularly in combination with simultaneous monitoring of the oscillation frequency, an acoustic surface wave element with a desired oscillation frequency can be obtained.

Figure 16:
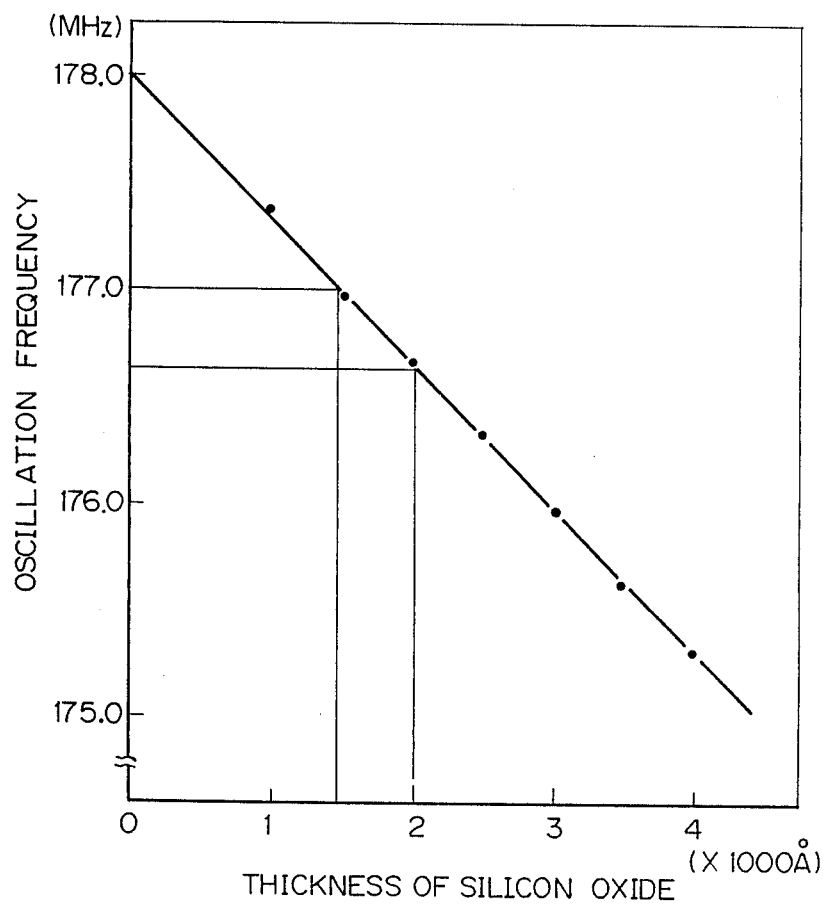
FIG. 16 shows the oscillation frequency in relation to the thickness of the silicon oxide layer.

FIG. 16 shows the oscillation frequency of an acoustic surface wave element with a silicon oxide film, formed over the silicon dioxide layer 5 (3.75 μm in thickness) by electron beam evaporation, as the insulator for adjusting the oscillation frequency 7 in relation to the thickness of the silicon oxide film 7. It is seen that, when the silicon oxide film 7 had a thickness 0.2 μm, the oscillation frequency of the element was reduced from 178.0 MHz (i.e., at zero thickness of silicon oxide and thus no film 7 being present) to 176.64 MHz (1.36 MHz reduction); thus an oscillation frequency of 177 MHz can be obtained by a silicon oxide film with a thickness of 0.15 μm.

Figure 17:
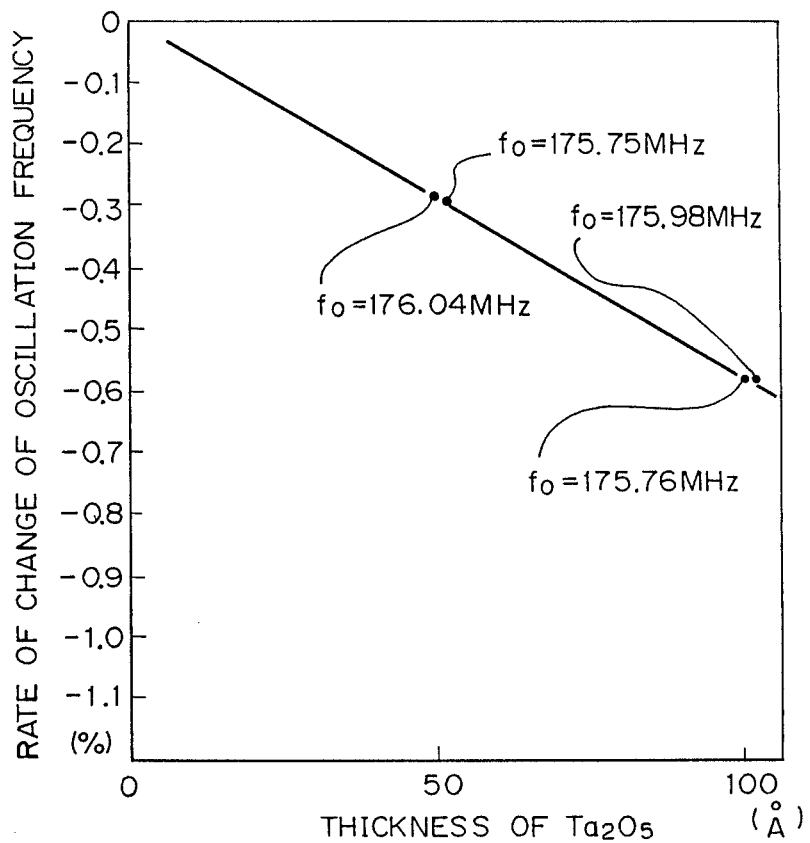
FIG. 17 shows the rate of change of the oscillation frequency in relation to the thickness of the tantalun pentaoxide layer.

FIG. 17 shows the rate of change of the oscillation frequency of an acoustic surface wave element with a tantalun pentaoxide film as the insulator for adjusting the oscillation frequency 7, in relation to the thickness of the tantalun pentaoxide film 7. The rate of change of the oscillation frequency was about −0.29% when the tantalun pentaoxide film had a thickness of 0.005 μm, and about −0.58% at a thickness of 0.01 μm.

Figure 18:
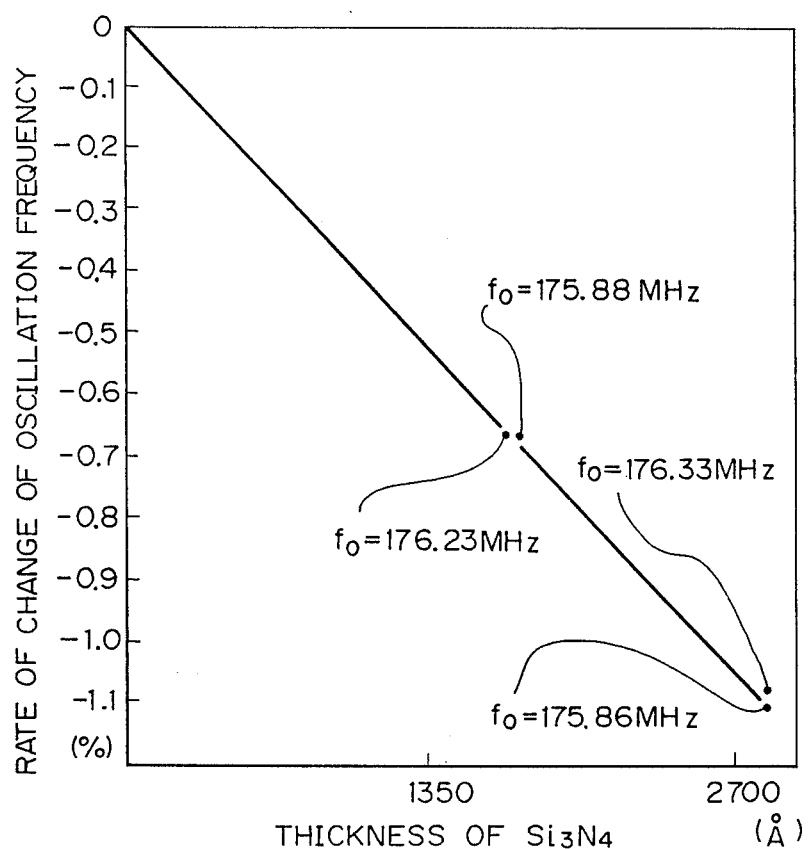
FIG. 18 shows the rate of change of the oscillation frequency in relation to the thickness of the silicon nitride layer.

FIG. 18 shows the rate of change of the oscillation frequency of an acoustic surface wave element with a silicon nitride film as the insulator for adjusting the oscillation frequency 7, in relation to the thickness of the silicon nitride film 7. The rate of change of the oscillation frequency was about −0.67% when the silicon nitride film had a thickness of 0.18 μm, and about −1.1% at a thickness of 0.3 μm.

Figure 19:
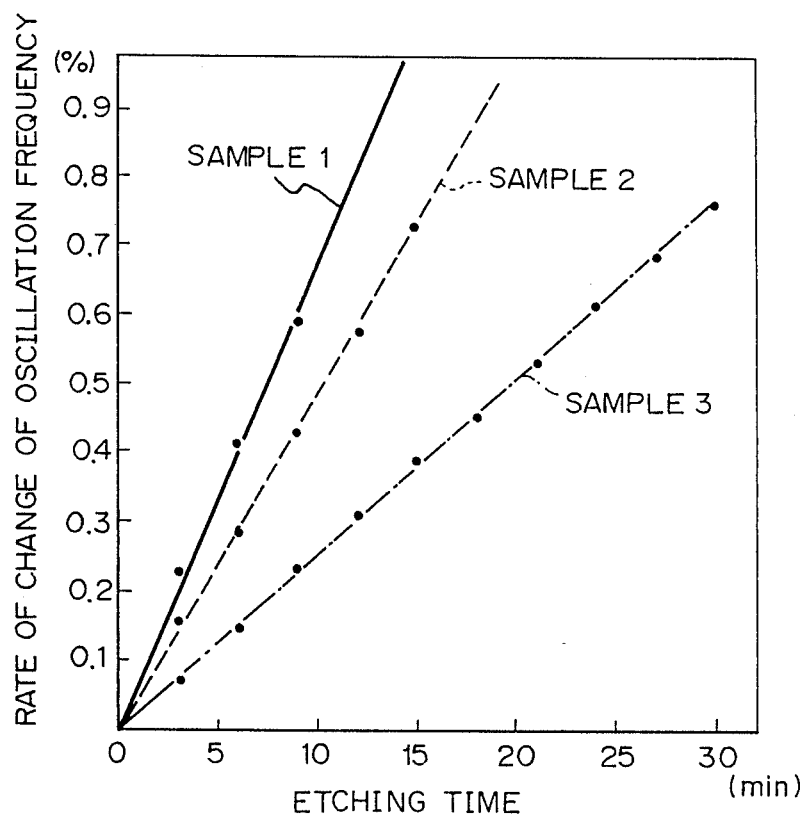
FIG. 19 shows the rate of change of the oscillation frequency in relation to the etching time of the silicon dioxide layer.

FIG. 19 shows the rate of change of the oscillation frequency of an acoustic surface wave element in which the silicon dioxide layer was etched for adjusting the oscillation frequency 7, in relation to the time of the etching. The etching was carried out by plasma etching in an atmosphere of carbon tetrafluoride, or a mixture of carbon tetrafluoride with an appropriate amount of oxygen, which does not corrode the electrodes and the wires employed for monitoring. The samples 1 to 3 were etched under the following different etching conditions:

TABLE

| Sample | Frequency MHz | Flow rate of CF$_4$ SCCM | Vacuum mTorr | Power W |
|---|---|---|---|---|
| 1 | 175.09 | 20 | 100 | 200 |
| 2 | 176.31 | 20 | 100 | 150 |
| 3 | 176.03 | 20 | 100 | 100 |

The rates of change of the oscillation frequency of an acoustic surface wave element change linearly with the etching time.

Returning to FIG. 1B, the acoustic surface wave element 1 has a pyroelectricity preventing film 8 on the side walls and the bottom surface thereof, according to a preferred embodiment of the present invention. Pyroelectricity occurs due to a change of the temperature of a piezoelectric material, and generates electric charges stored on the surfaces of the piezoelectric material; this is undesirable since it may cause discharge and extraordinary oscillation. The pyroelectricity preventing film 8 may be made of dielectric materials such as Al$_2$O$_3$, SiO$_2$, Ta$_2$O$_5$, B$_4$C, SiC, TiC, TiO$_2$, AlN, Si$_3$N$_4$; electric conductors such as titanium, chromium, gold; or electrically-conductive resins. The surface of the lithium tantalate substrate perpendicular to the X-axis of the lithium tantalate crystal is theoretically free from pyroelectricity, but minor defects may be formed by chipping during dicing, causing extraordinary oscillation, and therefore, that surface is preferably also covered by the pyroelectricity preventing film. The top surface of the substrate is already provided with a dielectric layer of the silicon dioxide layer 5 for controlling the temperature characteristic of the element according to the present invention, and therefore, no additional dielectric film for preventing the pyroelectricity is necessary on this surface. Further, no electrically-conductive material should cover this top surface of the substrate because of the electrodes and wires.

Figure 20A:
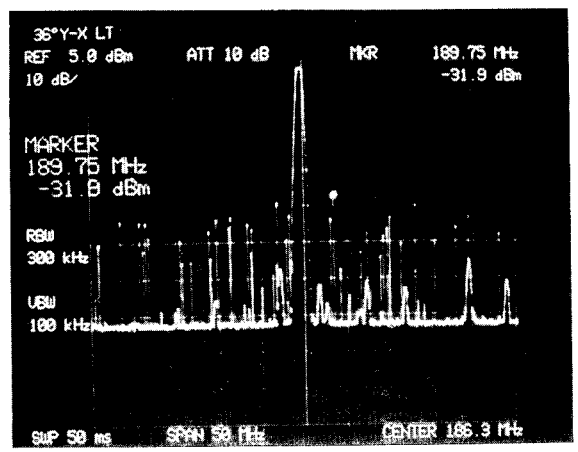
FIGS. 20A to 20C show the extraordinary oscillations of the elements with and without a pyroelectricity preventing film.
Figure 20B:
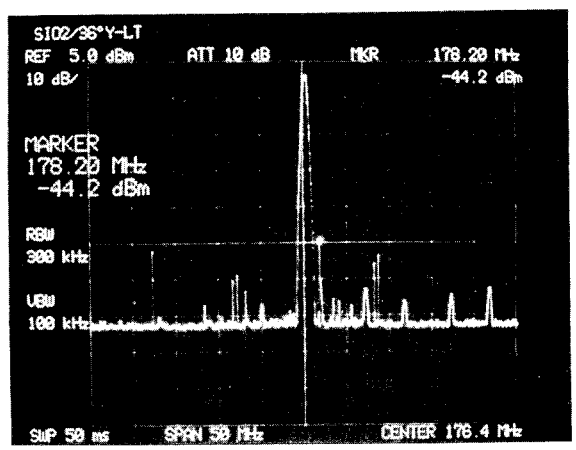
Figure 20C:
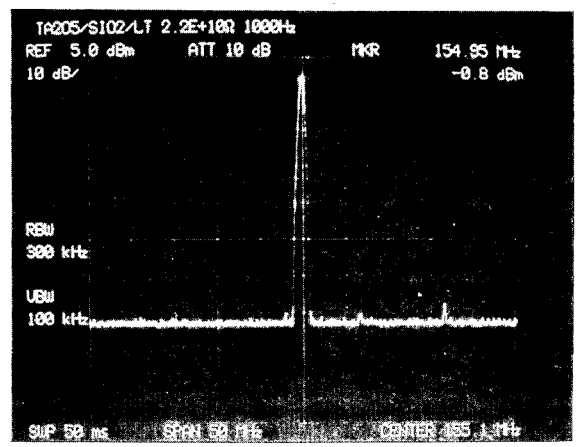
Figure 21:
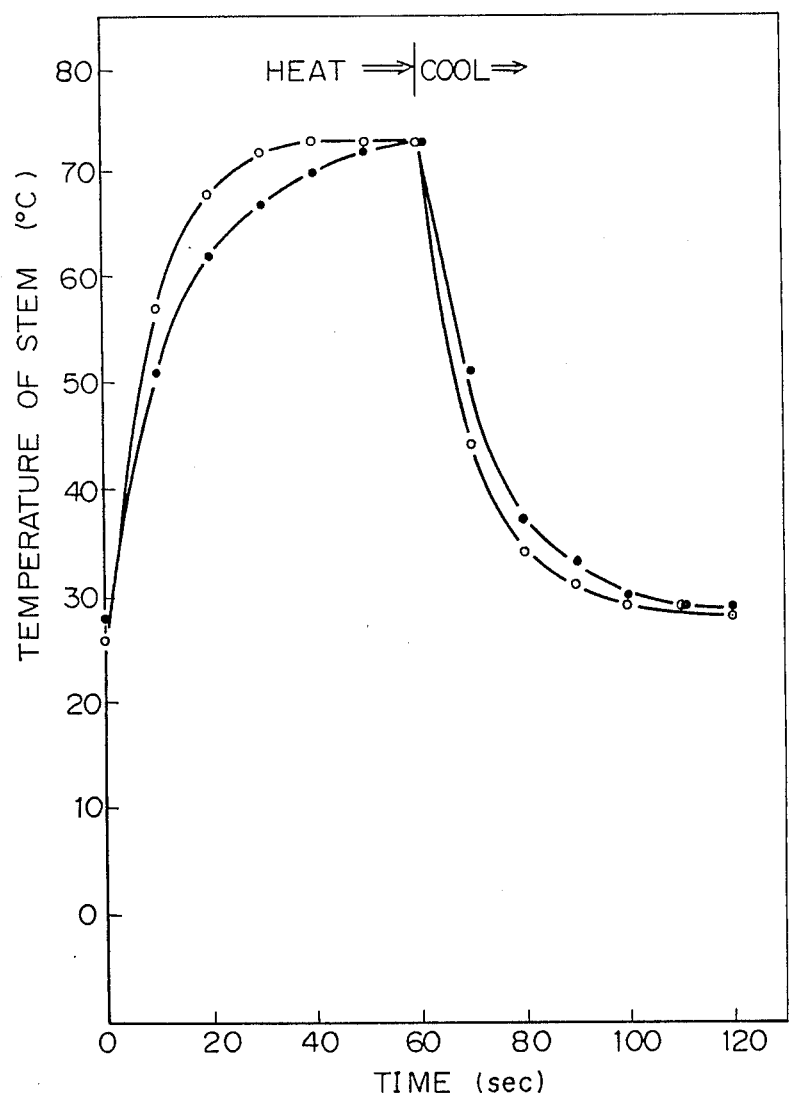
FIG. 21 shows the temperature change schedule for testing the extraordinary oscillations by pyroelectricity; and, FIGS. 22 and 23 show the number of the extraordinary oscillations by pyroelectricity in relation to the kinds and the thickness of the pyroelectricity preventing films.

FIG. 20A shows the extraordinary oscillation due to pyroelectricity of an acoustic surface wave element without a silicon dioxide layer 5 and a pyroelectricity preventing layer 8, in which the abscissa is the frequency. To examine the extraordinary oscillations due to pyroelectricity, a temperature change schedule as shown in FIG. 21 was applied to the element. FIG. 20B shows the extraordinary oscillation due to pyroelectricity of an acoustic surface wave element with a silicon dioxide layer 5 but without a pyroelectricity preventing layer 8. It is seen that the extraordinary oscillation due to pyroelectricity was considerably reduced by the silicon dioxide layer 5 but that it still occurred. FIG. 20C shows the extraordinary oscillation due to pyroelectricity of an acoustic surface wave element with a silicon dioxide layer 5 and a pyroelectricity preventing layer 8. The extraordinary oscillation due to pyroelectricity was completely eliminated by the silicon dioxide layer 5 and the pyroelectricity preventing layer 8.

Figure 22:
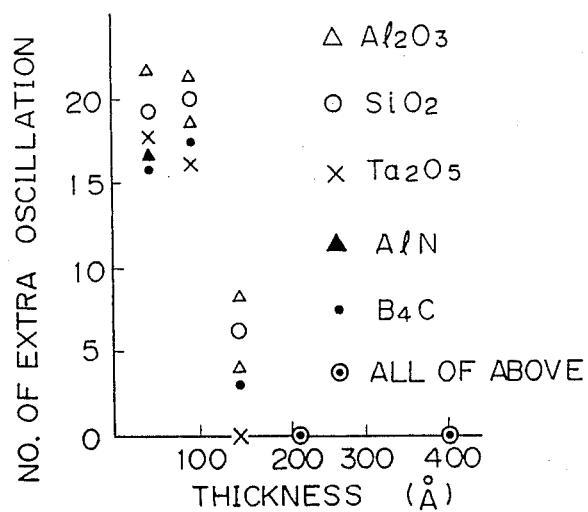
Figure 23:
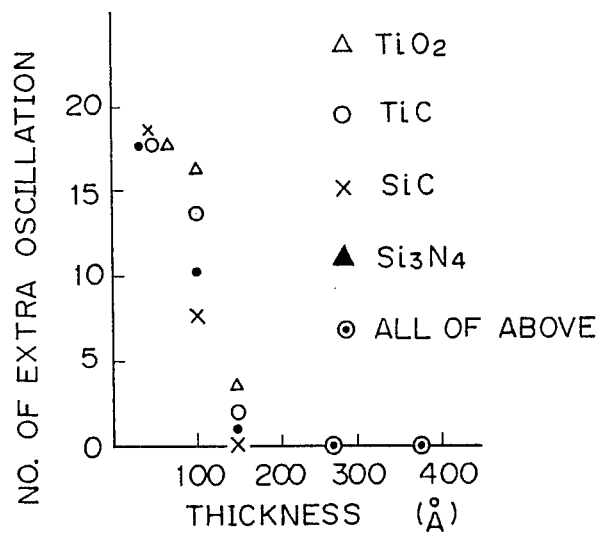

FIG. 22 and 23 show the number of extraordinary oscillations due to pyroelectricity in a predetermined time, of acoustic surface wave elements with a silicon dioxide layer 5 and a pyroelectricity preventing layer 8 of various dielectric materials, in relation to the thickness of the combined dielectric layers 5 and 8. It is seen that the extraordinary oscillation completely disappeared when the thickness of the combined dielectric layers 5 and 8 was 0.02 μm or more.

We claim:

1. An acoustic surface wave element, comprising:
   a substrate of a 36° rotated, Y-cut single crystal lithium tantalate having X, Y and Z crystal axes and a top surface and side walls;
   electrodes formed on the top surface of the substrate such that an acoustic surface wave is propagated in a direction of the X-axis of the substrate and an oscillation of the acoustic surface wave occurs at a predetermined frequency, the electrodes having a thickness in a range of from 1 to 4% of the wavelength of the acoustic surface wave at the predetermined frequency of oscillation; and
   a plasma CVD-deposited layer of silicon dioxide covering the electrodes and the substrate, the silicon dioxide layer having a refractive index in a range of from 1.445 to 1.486 and a thickness in a range of from 16 to 26% of the wavelength of the acoustic surface wave at the predetermined frequency of oscillation.

2. An acoustic surface wave element according to claim 1, wherein the silicon dioxide layer has a refractive index in a range of from 1.450 to 1.486.

3. An acoustic surface wave element according to claim 1, wherein the electrodes have a thickness in a range of from 2 to 3% of a wavelength of the acoustic surface wave at the predetermined frequency of oscillation.

4. An acoustic surface wave element according to claim 1, wherein the silicon dioxide layer has a thickness equal to 18 to 22% of the wavelength of the acoustic surface wave at the oscillation.

5. An acoustic surface wave element according to claim 1, having a temperature coefficient of the oscillation frequency of not more than 5 ppm/° C.

6. An acoustic surface wave element according to claim 1, further having an insulator film deposited over the silicon dioxide layer for adjusting the oscillation frequency.

7. An acoustic surface wave element according to claim 1, further having a dielectric layer at least on the side walls of the substrate, for preventing pyroelectricity.

8. An acoustic surface wave element according to claim 1, further having an electric conductor layer at least on the side walls but not on the top surface of the substrate, for preventing pyroelectricity.

9. An acoustic surface wave element according to claim 1, further comprising:
   etching stoppers of a metal formed on the electrodes;
   windows in the silicon dioxide layer exposing the etching stoppers; and
   external connection wires corresponding to and extending through the windows and electrically connected to the respective metal etching stoppers.

* * * * *

UNITED STATES PATENT AND TRADEMARK OFFICE
CERTIFICATE OF CORRECTION

PATENT NO. : 4,978,879

DATED : December 18, 1990

INVENTOR(S) : Kiyoshi SATOH et al.

It is certified that error appears in the above-identified patent and that said Letters Patent is hereby corrected as shown below:

On the Title page, item [56],

U.S. PATENT DOCUMENTS:
        third reference, change "319/313 A" to --310/313 A--;

OTHER PUBLICATIONS:
        first reference, line 2, change "Fablicated" to --Fabricated--.
            line 3, change "Cho-ompha" to --Cho-ompa--;
        second reference, line 2, change "Fablicated" to --Fabricated--.

Col. 2,   lines 14 & 18, change "a" to --the--;
           line 63, delete "show" and change "plats" to --plots--;
           line 66, change "plats to --plots-- and delete "show".

Col. 3,   lines 1 & 4, change "shows" to --show--;

Col. 4,   line 22, delete "and";
           line 57, delete "FIG. 5,";
           line 58, delete "shows a" and after "Q" insert --,--;
           line 60, change "and to" to --to and--;
           line 62, after "5C)" insert --of,--.

UNITED STATES PATENT AND TRADEMARK OFFICE
CERTIFICATE OF CORRECTION

PATENT NO. :    4,978,879
DATED      :    December 18, 1990
INVENTOR(S) :   Kiyoshi SATOH et al.

It is certified that error appears in the above-identified patent and that said Letters Patent is hereby corrected as shown below:

```
   Col. 5,   line 5, change "FIGS." to --FIG.--;
             line 11, change "preferably" to --preferable,--;
             line 27, change "6" to --6A--, change "plats" to --plots--,
and delete "shows";
             line 43, change "shows" to --the--;
*            line 45, change "SiHc" to --SiH4--;
             lines 60-61, delete "(FIG. 7C)";
             line 62, after "rate" insert --(FIG. 7C)--;
             line 63, delete "shows";
             line 65, delete "(FIG. 8B)" and after "frequency" insert
--, respectively,--;
             line 66, after "layer" insert --commonly plotted on the
abscissa of FIG. 8B--;
             line 67, change "a" to --the--;
             line 68, change "a" to --the--.

Col. 6,   line 2, after "frequency" insert --(FIG. 8B)--;
*            line 38, after "relation" insert --to--;
             line 68, change "(T/" to --(t--.

Col. 7,   line 40, delete "is";
             line 42, after "or" insert --less,--.

Col. 8,   line 2, after "frequency" insert --,--, and change "form" to
--formed--.
```

UNITED STATES PATENT AND TRADEMARK OFFICE
CERTIFICATE OF CORRECTION

PATENT NO. : 4,978,879

DATED : December 18, 1990

INVENTOR(S) : Kiyoshi SATOH et al.

It is certified that error appears in the above-identified patent and that said Letters Patent is hereby corrected as shown below:

Col. 9, line 12, change "The" to --As shown in FIG. 19, the--;
\*         line 61, change "FIG." to --FIGS.--.

\*  Col. 10, line 37, change "equal to" to --in a range of from--;
\*        line 38, after "the" insert --predetermined frequency of--.

Signed and Sealed this

Twenty-ninth Day of June, 1993

Attest:

MICHAEL K. KIRK

Attesting Officer      Acting Commissioner of Patents and Trademarks